United States Patent
Hwang

(10) Patent No.: US 9,155,210 B2
(45) Date of Patent: Oct. 6, 2015

(54) DISPLAY APPARATUS

(71) Applicant: Samsung Display Co., Ltd., Yongin (KR)

(72) Inventor: Sungyeon Hwang, Uijeongbu-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 206 days.

(21) Appl. No.: 13/692,562

(22) Filed: Dec. 3, 2012

(65) Prior Publication Data
US 2014/0002969 A1    Jan. 2, 2014

(30) Foreign Application Priority Data
Jun. 27, 2012    (KR) .......................... 10-2012-0069126

(51) Int. Cl.
| G06F 1/16 | (2006.01) |
|---|---|
| H05K 5/00 | (2006.01) |
| H05K 5/02 | (2006.01) |
| G02F 1/1333 | (2006.01) |

(52) U.S. Cl.
CPC ............ *H05K 5/0017* (2013.01); *G02F 1/1333* (2013.01); *G06F 1/1601* (2013.01); *G06F 1/1607* (2013.01); *G06F 1/1616* (2013.01); *G06F 1/1637* (2013.01); *H05K 5/0217* (2013.01)

(58) Field of Classification Search
CPC ..... G06F 1/1616; G06F 1/1637; G06F 1/165; G06F 1/1698; G06F 1/1601; G06F 1/16; G06F 1/1603; G06F 1/1605; G06F 1/1607; G06F 1/1609; G06F 1/1611

USPC .............. 361/679.21, 679.22, 679.26, 679.3; 349/56, 58, 60

See application file for complete search history.

(56) References Cited

U.S. PATENT DOCUMENTS

| 5,923,319 | A | 7/1999 | Bishop et al. | |
|---|---|---|---|---|
| 6,593,979 | B1 | 7/2003 | Ha et al. | |
| 6,594,143 | B2 * | 7/2003 | Yano et al. | ............... 361/679.26 |
| 7,106,317 | B2 * | 9/2006 | Kim et al. | ...................... 345/206 |
| 7,310,222 | B2 * | 12/2007 | Bovio et al. | .............. 361/679.27 |
| 7,580,250 | B2 | 8/2009 | Shin et al. | |

(Continued)

FOREIGN PATENT DOCUMENTS

| JP | 2008-286860 | 11/2008 |
|---|---|---|
| JP | 2010-175705 | 8/2010 |
| KR | 10-2001-0048194 | 6/2001 |
| KR | 10-2005-0065020 | 6/2005 |
| KR | 10-2007-0076288 | 7/2007 |
| KR | 10-2008-0002583 | 1/2008 |

(Continued)

*Primary Examiner* — Anthony Haughton
(74) *Attorney, Agent, or Firm* — H.C. Park & Associates, PLC

(57) ABSTRACT

A display apparatus includes a display unit which displays an image, a receiving container which accommodates the display unit, and a top cover which comprises a plurality of sub-covers to cover an edge of the display unit and is coupled to the receiving container. The receiving container comprises a fixing protrusion corresponding to a position that two sub-covers of the sub-covers overlap with each other, and each of the two sub-covers comprises a fixing hole coupled to the fixing protrusion.

21 Claims, 10 Drawing Sheets

(56) References Cited

U.S. PATENT DOCUMENTS

| | | | |
|---|---|---|---|
| 7,688,575 B2 * | 3/2010 | Takayanagi et al. | 361/679.21 |
| 7,697,272 B2 * | 4/2010 | Choi | 361/679.21 |
| 7,940,287 B2 | 5/2011 | Kim et al. | |
| 7,973,872 B2 | 7/2011 | Kim et al. | |

FOREIGN PATENT DOCUMENTS

| | | |
|---|---|---|
| KR | 10-2009-0100949 | 9/2009 |
| KR | 10-2010-0053369 | 5/2010 |
| KR | 10-2010-0127578 | 12/2010 |
| KR | 10-2011-0080991 | 7/2011 |

* cited by examiner

DISPLAY APPARATUS

This application claims priority to Korean Patent Application No. 10-2012-0069126, filed on Jun. 27, 2012, and all the benefits accruing therefrom under 35 U.S.C. §119, the entire contents of which are hereby incorporated by reference for all purposes as if fully set forth herein.

BACKGROUND

1. Technical Field

The disclosure relates to a display apparatus. More particularly, the disclosure relates to a display apparatus capable of improving a bonding strength between components thereof.

2. Description of the Background

In general, a flat panel display apparatus such as a liquid crystal display apparatus includes a display panel that displays an image and a backlight unit that provides the display panel with light. The flat panel display apparatus employs a bottom cover and a top cover to couple the display panel and the backlight unit with each other. The bottom cover and the top cover are formed of a metallic material.

In general, the bottom cover or the top cover is integrally formed as a single unitary and indivisible unit, but at least one of a bottom cover and a top cover which is employed in a large size display apparatus such as a television is formed as a divisible unit comprising a plurality of sub-chassis coupled to each other. However, when using the plural of sub-chassis, a gap between the plural of sub-chassis occurs and the gap causes deterioration of a bonding strength and an assembly quality of the display apparatus.

SUMMARY

Illustrated embodiments provide a display apparatus capable of improving a bonding strength between components of the display apparatus employing a narrow bezel structure which a width of an outside area surrounding an active area of a display panel is narrow.

An illustrated embodiment of the invention provide a display apparatus which includes a display unit which displays an image, a backlight unit which provides the display unit with a light, a receiving container which accommodates the backlight unit, and a top cover which comprises a plurality of sub-covers to cover an edge of the display unit and is coupled to the receiving container. The receiving container comprises a fixing protrusion corresponding to a position that adjacent two sub-covers of the sub-covers overlap each other, and each of the two sub-covers comprises a fixing hole coupled to the fixing protrusion.

According to the one or more illustrated embodiments, in a structure in which the top cover employs the plurality of sub-covers, at least two sub-covers are engaged to the fixing protrusion formed on the receiving container, thereby improving a bonding strength between the two sub-covers and preventing a gap phenomenon between the pluralities of sub-covers.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
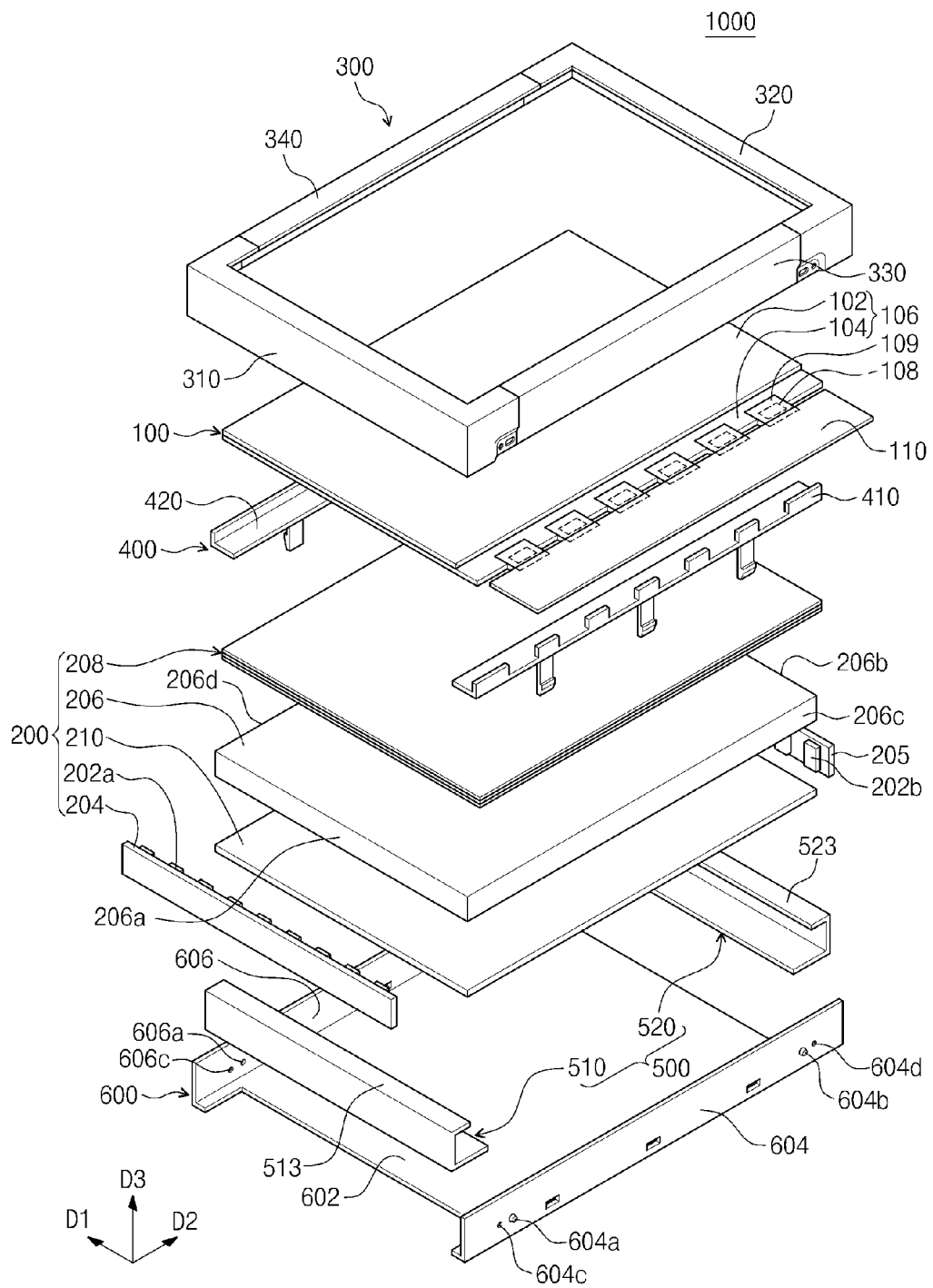
FIG. 1 is an exploded perspective view showing an exemplary embodiment of a display apparatus according to the embodiment of the invention.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "under," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiment of the invention will be explained in detail with reference to the accompanying drawings.

FIG. 1 is an exploded perspective view showing a display apparatus according to an exemplary embodiment of the invention.

Referring to FIG. 1, a display apparatus 1000 includes a display unit 100, a backlight unit 200, a top cover 300, a mold frame 400, a heat sink plate 500, and a bottom cover 600.

The display apparatus 1000 has a rectangular shape when viewed in a plan view. In this exemplary embodiment, for the convenience of explanation, a short axis direction of the display apparatus 1000 is referred to as a first direction D1, and a long axis direction of the display apparatus 1000 is referred to as a second direction D2 substantially perpendicular to the first direction D1. The short axis direction corresponds to a direction to which short sides of the rectangular shape extend. In addition, the bottom cover 600, the backlight unit 200, the mold frame 400, the display unit 100, and the top cover 300 of the display apparatus 1000 are sequentially stacked in a third direction D3 substantially orthogonal (e.g., vertical in FIG. 1) to the first and second directions D1 and D2.

The display unit 100 includes a display panel 106 that displays an image, a driving chip 108 that applies a driving signal to the display panel 106, and a printed circuit board 110 that is electrically connected to the display panel 106.

The display panel 106 includes a first substrate 102, a second substrate 104 that faces the first substrate 102 while being coupled with the first substrate 102, and a liquid crystal layer (not shown) interposed between the first substrate 102 and the second substrate 104. While a liquid crystal display panel has been shown as the display panel 106 in FIG. 1 as an example, the display panel 106 should not be limited to the liquid crystal display panel.

The first substrate 102 includes a plurality of pixels arranged in a matrix form. In one exemplary embodiment, each pixel includes a gate line (not shown) extended in the first direction D1, a data line (not shown) extended in the second direction D2 and insulated from the gate line while crossing the gate line, and a pixel electrode (not shown). In addition, each pixel includes a thin film transistor (not shown) connected to the gate line, the data line and the pixel electrode.

The second substrate 104 includes red, green and blue ("RGB") pixels (not shown) as color pixels, and a common electrode (not shown) facing the pixel electrode of the first substrate 102. The color pixels and the common electrode may be disposed on the first substrate 102 according to alternative embodiments. The liquid crystal layer includes liquid crystal molecules arranged in accordance with an intensity of an electric field generated between the pixel electrode and the common electrode, so that a transmittance of light passing through the liquid crystal layer is controlled by the liquid crystal molecules. As a result, a desired image may be displayed on the display panel 106.

The driving chip 108 may be disposed adjacent to at least one side of the first substrate 102 in the plan view, to apply a data signal to the data line. The driving chip 108 generates the data signal in response to an external signal and the data signal is applied to the data line of the display panel 106. The external signal is provided from the printed circuit board 110 and includes various signals, such as an image signal, various control signals, a driving voltage, etc.

The first substrate 102 may include a gate driving circuit on the other side of the first substrate 102 to apply a gate signal to the gate line. The gate driving circuit may be on the other side through a thin film process during forming of the display apparatus. Thus, the gate driving circuit may be embedded within the display panel 106.

As another alternative embodiment, the driving chip 108 may be provided with at least two chips, e.g., data and gate driving chips, and mounted on the first substrate 102 through a chip-on-glass ("COG").

The printed circuit board 110 may be electrically connected to the display panel 106 by a plurality of tape carrier packages ("TCPs") 109. The driving chip 108 may be mounted on the TCPs 109 and the TCPs 109 are bent to surround a side surface of the bottom cover 600.

The printed circuit board 110 connected to the TCPs 109 is disposed under the bottom cover 600. When the printed circuit board 110 is under the bottom cover 600, the display apparatus 1000 may further include a shield case (not shown) disposed under the bottom cover 600 to protect the printed circuit board 110.

The backlight unit 200 includes a first light source 202a and a second light source 202b that generate and emit the light, and a light guide plate 206 that guides the light from the first and second light sources 202a and 202b to the display unit 100.

In the exemplary embodiment, the backlight unit 200 may be, but is not limited to, an edge-illumination type backlight unit. That is, the first and second light sources 202a and 202b of the backlight unit 200 provide the light to at least one side surface of the light guide plate 206 which is under and overlapping the display panel 106, and the light guide plate 206 guides the light to the display unit 100.

The light guide plate 206 includes a first side surface 206a having a longitudinal axis extended in the first direction D1 of the display apparatus 1000, a second side surface 206b substantially parallel to the first side surface 206a, a third side surface 206c having a longitudinal axis extended in the second direction D2 of the display apparatus 1000, and a fourth side surface 206d substantially parallel to the third side surface 206c. In the exemplary embodiment, the first light source 202a is disposed adjacent to the first side surface 206a of the light guide plate 206 and the second light source 202b is disposed adjacent to the second side surface 206b of the light guide plate 206.

The backlight unit 200 may further include a first light source supporter 204 to support the first light source 202a and a second light source supporter 205 to support the second light source 202b. The first and second light source supporters 204 and 205 are disposed to face the first and second side surfaces 206a and 206b of the light guide plate 206, respectively, and have a plate-like shape. Each of the first and second light sources 202a and 202b may include a plurality of light emitting diodes. The light emitting diodes are arranged on the first and second light source supporters 204 and 205 along the first direction D1 to be spaced apart from each other.

The backlight unit 200 further includes a plurality of optical sheets 208 disposed between the light guide plate 206 and the display unit 100, and a reflective plate 210 disposed under the light guide plate 206.

The optical sheets 208 include a diffusion sheet that diffuses the light and at least one light condensing sheet that condenses the light so as to improve brightness and viewing angle of the light exiting from an exit surface of the light guide plate 206. The reflective plate 210 reflects the light leaked from a reflective surface of the light guide plate 206, so that the light reflected by the reflective plate 210 is incident again to the light guide plate 206.

The bottom cover 600 includes a bottom portion 602 on which the backlight unit 200 is mounted and sidewalls 604 and 606 extended in a vertical direction, e.g., the third direction D3, from the bottom portion 602. In the exemplary embodiment, the sidewalls 604 and 606 comprise a first sidewall 604 and a second sidewall 606 that are extended from two end portions of the bottom portion 602 substantially parallel to the second direction D2.

The heat sink plate 500 comprises a first heat sink plate 510 disposed adjacent to the first light source 202a and a second heat sink plate 520 disposed adjacent to the second light source 202b. The first and second heat sink plates 510 and 520 are mounted on two end portions of the bottom portion 602 where the first and second sidewalls 604 and 606 are not extended from the bottom portion 602, respectively. Sidewalls adjacent to the first and second light sources 202a and 202b are absent from the bottom cover 600 to expose the first and second heat sink plates 510 and 520. Even not shown in drawings, an auxiliary chassis which has heat conductivity may be provided along an outer surface of the heat sink plate 500, thereby the heat sink plate 500 may not be exposed to exterior. In this case, the bottom cover 600 may receive the auxiliary chassis. The heat from the first and second light sources 202a and 202b may be released to an outside through the heat sink plate 500 and the auxiliary chassis.

The heat sink plate 500 comprises a material having a heat sink property better than a material of the bottom cover 600. Therefore, heat generated from the first and second light sources 202a and 202b is released through the heat sink plate 500 to an outside. Or the heat generated from the first and second light sources 202a and 202b may be released to an outside through the heat sink plate 500 and the bottom cover 600 sequentially when the heat tank plate 500 is not exposed to the exterior. In another exemplary embodiment, when the bottom cover 600 comprises a material having an adequate heat sink property, the first and second heat sink plates 510 and 520 may be omitted from the display apparatus 1000. In this case, the bottom cover 600 further comprises a third side wall (not shown) adjacent to the first light source 202a and a fourth side wall (not shown) adjacent to the second light source 202b. In addition, the bottom cover 600 further comprises a first cover portion (not shown) and a second cover portion (not shown) which are extended from the third and fourth side walls, respectively, are substantially parallel to the bottom portion 602, and cover the first and second light sources 202a and 202b to prevent the light generated from the first and second light sources 202a and 202b from being leaked.

The mold frame 400 is disposed between the display unit 100 and the backlight unit 200 to support the display panel 106. The mold frame 400 includes a first sub-mold 410 and a second sub-mold 420. The first and second sub-molds 410 and 420 are disposed substantially parallel to two long sides of the display panel 106. Therefore, the first and second sub-molds 410 and 420 support the two long sides of the display panel 106, respectively, but not limited thereto. For example, the sub-molds such as a third and fourth sub-molds may be respectively provided along the two long sides as well as the two short sides. The first and second sub-molds 410 and 420 may be coupled with the first and second sidewalls 604 and 606 of the bottom cover 600, respectively. The coupling structure between the mold frame 400 and the bottom cover 600 will be described later with drawings.

In an exemplary embodiment, the first heat sink plate 510 comprises a first supporting portion 513 that is disposed on an upper end portion of the first heat sink plate 510 to support one short side of the display panel 106, and the second heat sink plate 520 comprises a second supporting portion 523 that is disposed on an upper end portion of the second heat sink plate 520 to support the other short side of the display panel 106. However, the shape of the first and second heat tank plates 510 and 520 is not limited thereto. For example, the first and second heat tank plates 510 and 520 have just a part of the supporting portions 513 and 523, thereby the third and fourth sub-molds may support the other short side of the display panel 106.

The top cover 300 faces the bottom cover 600 and is coupled with the bottom cover 600 to cover the edge of the display panel 106. In an exemplary embodiment, the top cover 300 comprises a first sub-cover 310, a second sub-cover 320, a third sub-cover 330, and a fourth sub-cover 340. The first and second sub-covers 310 and 320 are disposed along the short sides of the display panel 106, and the third and fourth sub-covers 330 and 340 are disposed along the long sides of the display panel 106. As shown in FIG. 1, the third and fourth sub-covers 330 and 340 have a bar shape extended in the second direction D2, and each of the first and second sub-covers 310 and 320 has a shape with bending two end portions thereof in the second direction D2.

top cover In an alternative embodiment, the first and second sub-covers 310 and 320 may have a bar shape extended in the first direction D1, and each of the third and fourth sub-covers 330 and 340 may have a shape with bending two end portions thereof in the first direction D1.

Figure 2:
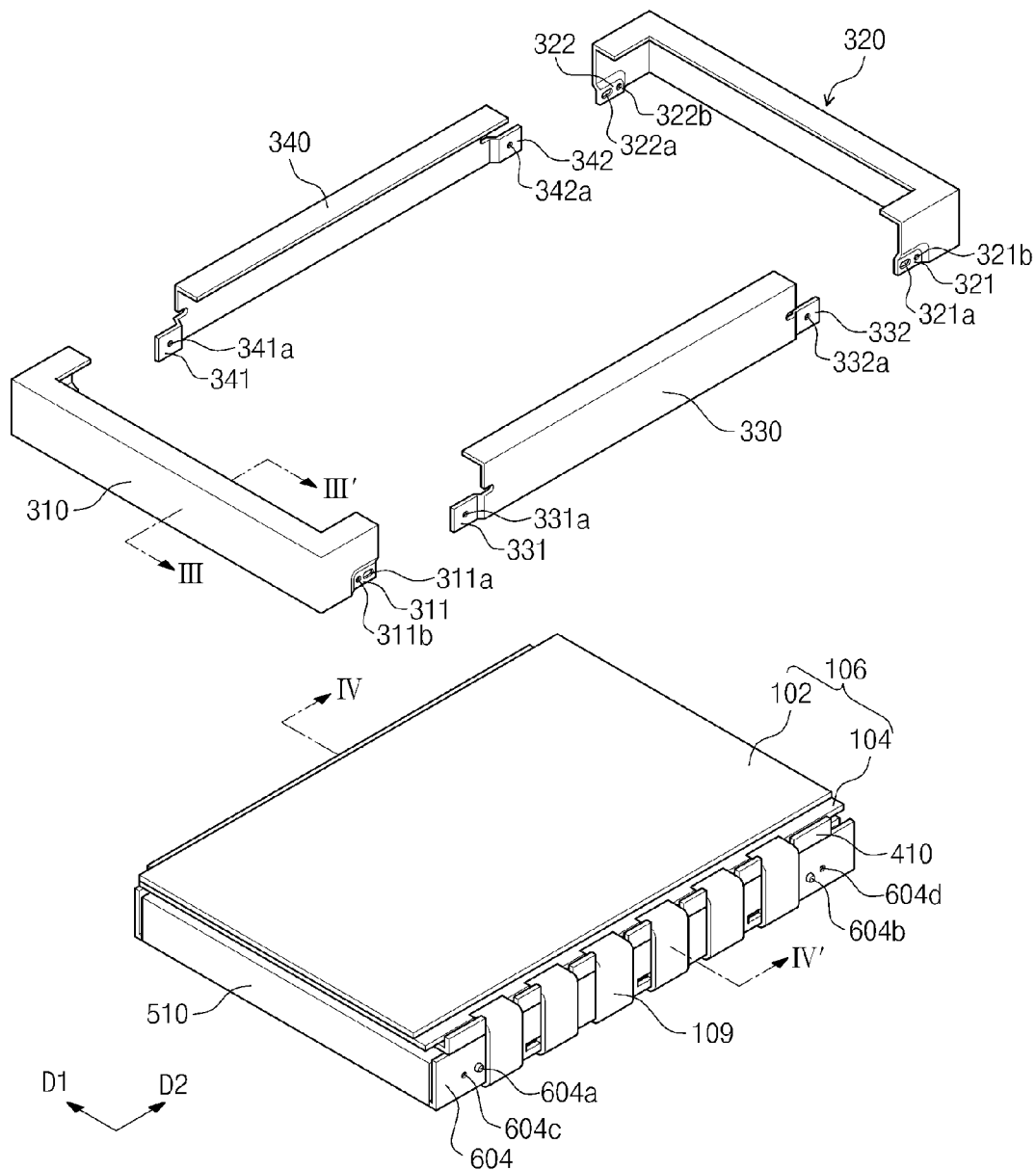
FIG. 2 is an exploded perspective view showing a top cover shown in FIG. 1.
Figure 3:
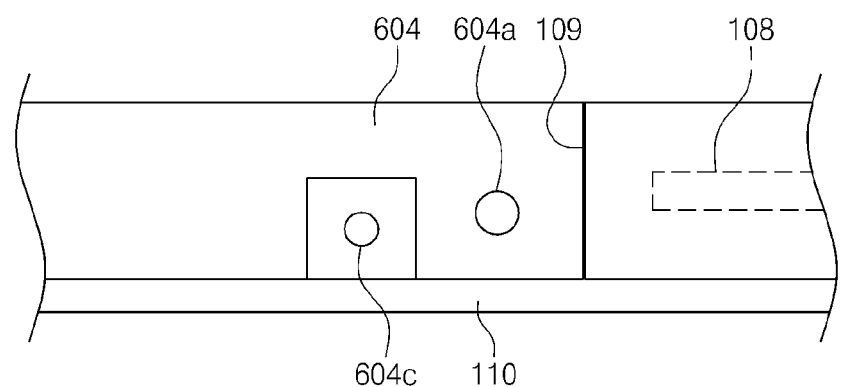
FIG. 3 is a side view showing a bottom cover shown in FIG. 1.

FIG. 2 is an exploded perspective view showing a top cover shown in FIG. 1, and FIG. 3 is a side view showing a bottom cover shown in FIG. 1.

Referring to FIG. 2, when the bottom cover 600 is coupled with the first and second heat sink plates 510 and 520, the backlight unit 200 is accommodated in a receiving space defined by the bottom cover 600 and the first and second heat sink plates 510 and 520. The first and second sub-molds 410 and 420 are coupled with the bottom cover 600, and the display panel 106 is mounted on the first and second sub-molds 410 and 420. The TCPs 109 attached at the display panel 106 are bent along the first sidewall 604 of the bottom cover 600, and the printed circuit board 110 is disposed facing a rear surface of the bottom cover 600. Alternatively, the printed circuit board 110 may be disposed facing the first sidewall 604 of the bottom cover 600.

Each of the first and second sidewalls 604 and 606 of the bottom cover 600 comprises at least two fixing protrusions. In an exemplary embodiment, the two fixing protrusions provided to the first sidewall 604 are referred to as a first fixing protrusion 604a and a second fixing protrusion 604b, respectively, and the two fixing protrusions provided to the second sidewall 606 are referred to as a third fixing protrusion (not shown) and a fourth fixing protrusion (not shown), respectively.

As shown in FIG. 3, the TCPs 109 are spaced apart from each other on the first sidewall 604 of the bottom cover 600. In this case, each of the first and the second fixing protrusions 604a and 604b may be positioned in a space between two flexible films adjacent to each other or at an outside of outermost flexible film of the plurality of flexible films. Since the TCPs 109 are absent on the second sidewall 606, locations of the third and fourth fixing protrusions are not limited.

In the case that the printed circuit board 110 is disposed facing the first sidewall 604 of the bottom cover 600, the printed circuit board 110 may be positioned between the first and second fixing protrusions 604a and 604b.

Although not shown in FIG. 1 and FIG. 2, the TCPs 109 and the printed circuit board 110 may be attached at the short side of the display panel 106. In this case, locations of the first and second fixing protrusions 604a and 604b provided to the first sidewall 604 are not constrained by the TCPs 109 or the printed circuit board 110.

Referring to FIG. 2 again, the top cover 300 includes a first sub-cover 310, a second sub-cover 320, a third sub-cover 330, and a fourth sub-cover 340.

The first and second sub-covers 310 and 320 are disposed along the short sides of the display panel 106, and the third and fourth sub-covers 330 and 340 are disposed along the long sides of the display panel 106.

In addition, two end portions of each of the first and second sub-covers 310 and 320 are bent and extended in the second direction D2. A first end portion of the first sub-cover 310 includes a first receiving portion 311 recessed from a sidewall thereof in a predetermined depth, and a second end portion of the first sub-cover 310 includes a second receiving portion (not shown) recessed from a sidewall thereof in a predetermined depth. A first end portion of the third sub-cover 330 includes a first protruding portion 331 extended to the first sub-cover 310, and a first end portion of the fourth sub-cover 340 includes a third protruding portion 341 extended to the first sub-cover 310. The first protruding portion 331 overlaps with the first receiving portion 311 when the first sub-cover 310 and the third sub-cover 330 are assembled, and the third protruding portion 341 overlaps with the second receiving portion when the first sub-cover 310 and the fourth sub-cover 340 are assembled.

A first end portion of the second sub-cover 320 includes a third receiving portion 321 recessed from a sidewall thereof in a predetermined depth, and a second end portion of the second sub-cover 320 includes a fourth receiving portion 322 recessed from a sidewall thereof in a predetermined depth. A second end portion of the third sub-cover 330 includes a second protruding portion 332 extended to the second sub-cover 320, and a second end portion of the fourth sub-cover 340 includes a fourth protruding portion 342 extended to the second sub-cover 320. The second protruding portion 332 overlaps with the third receiving portion 321 when the second sub-cover 320 and the third sub-cover 330 are assembled, and the fourth protruding portion 342 overlaps with the fourth receiving portion 322 when the second sub-cover 320 and the fourth sub-cover 340 are assembled.

The first and third protruding portions 331 and 341 have a first fixing hole 331a and a third fixing hole 341a, respectively. The first and second fixing holes 331a and 332a are engaged to the first and second fixing protrusions 604a and 604b which are provided to the first sidewall 604 of the bottom cover 600, respectively. The third and fourth protruding portions 341 and 342 have a third fixing hole 341a and a fourth fixing hole 342a, respectively. The third and fourth fixing holes 341a and 342a are engaged to the third and fourth fixing protrusions (not shown) which are provided to the second sidewall 606 of the bottom cover 600, respectively.

The first receiving portion 311 of the first sub-cover 310 includes a fifth fixing hole 311a formed there through, and the second receiving portion of the first sub-cover 310 includes a sixth fixing hole (not shown) formed there through. The third receiving portion 321 of the second sub-cover 320 includes a seventh fixing hole 321a formed there through, and the fourth receiving portion 322 of the second sub-cover 320 includes an eighth fixing hole 322a which are formed there through.

In an exemplary embodiment, the fifth, sixth, seventh and eighth fixing holes 311a, (not shown), 321a and 322a have an elliptical shape extended in the second direction D2.

After the third and fourth sub-covers 330 and 340 are engaged to the bottom cover 600, the first and second sub-covers 310 and 320 are engaged to the bottom cover 600. In particular, the third and fourth sub-covers 330 and 340 are coupled with the bottom cover 600 by engaging the first, second, third and fourth fixing holes 331a, 332a, 341a, and 342a which are formed through the first, second, third and fourth protruding portions 331, 332, 341 and 342, respectively, to the first, second, third and fourth fixing protrusions 604a, 604b, (not shown), and (not shown) of the bottom cover 600.

Then, the first and second sub-covers 310 and 320 are coupled with the bottom cover 600 by engaging the fifth, sixth, seventh, and eighth fixing holes 311a, (not shown), 321a and 322a which are formed through the first, second, third and fourth receiving portions 311, (not shown), 321, and 322, respectively, to the first, second, third, and fourth fixing protrusion 604a, 604b, (not shown) and (not shown) of the bottom cover 600.

The first sidewall 604 of the bottom cover 600 further includes a first engaging hole 604c and a second engaging hole 604d, and the second sidewall 606 of the bottom cover 600 further includes a third engaging hole (not shown) and a fourth engaging hole (not shown). The first receiving portion 311 of the first sub-cover 310 includes a fifth engaging hole 311b corresponding to the first engaging hole 604c, and the second receiving portion 312 of the first sub-cover 310 includes a sixth engaging hole (not shown) corresponding to the third engaging hole. The third receiving portion 321 of the second sub-cover 320 includes a seventh engaging hole 321b corresponding to the second engaging hole 604d, and the fourth receiving portion 322 of the second sub-cover 320 includes an eighth engaging hole 322b corresponding to the fourth engaging hole.

Figure 4:
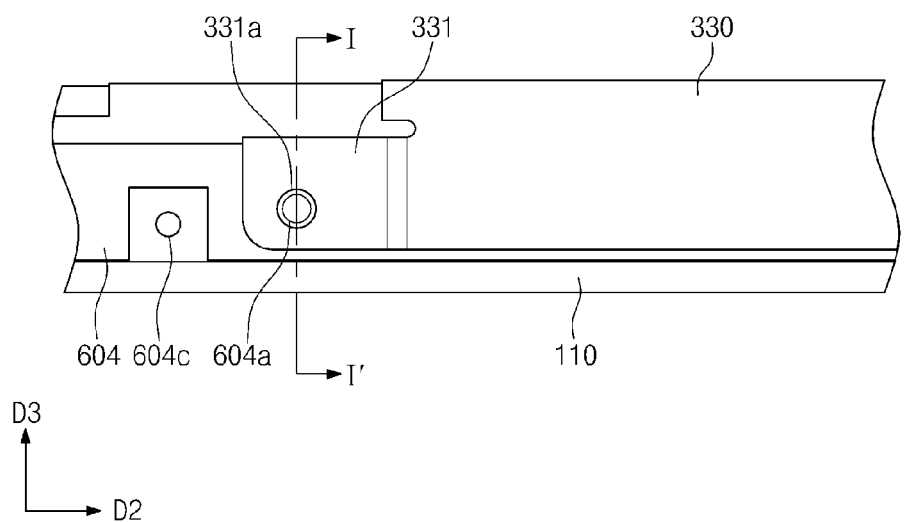
FIG. 4 is a side view showing an exemplary embodiment of a coupling structure between a bottom cover and a third sub-cover.
Figure 5:
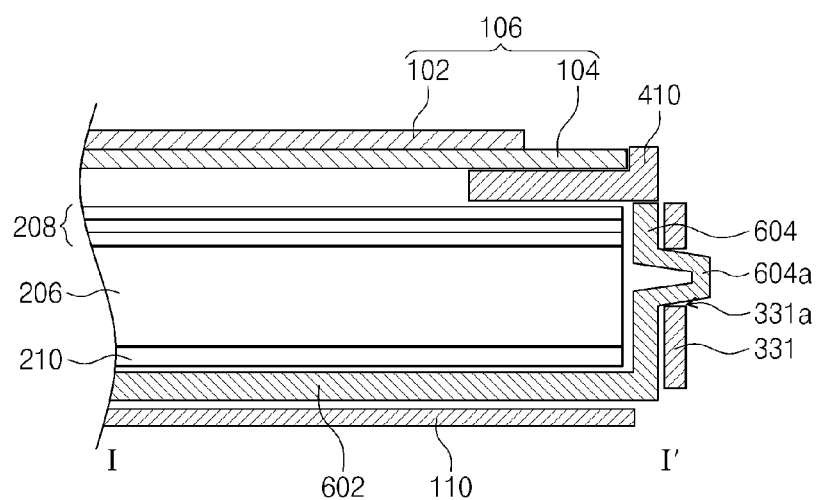
FIG. 5 is a cross-sectional view taken along line I-I' shown in FIG. 4.

FIG. 4 is a side view showing an exemplary embodiment of a coupling structure between a bottom cover and a third sub-cover, and FIG. 5 is a cross-sectional view taken along line I-I' shown in FIG. 4. In FIG. 4 and FIG. 5, a coupling structure between the first protruding portion 331 of the third sub-cover 330 and the bottom cover 600 has been shown. The second protruding portion 332 of the third sub-cover 330 and the third and fourth protruding portions 341 and 342 of the fourth sub-cover 340 are coupled with the bottom cover 600 in the substantially similar manner as the first protruding portion 331.

Referring to FIG. 4 and FIG. 5, the bottom cover 600 includes a first fixing protrusion 604a protruded from the first sidewall 604 toward an outside through a press process. When the third sub-cover 330 is mounted on the display panel 106 to cover an edge of the long side of the display panel 106, the first fixing hole 331a is engaged to the first fixing protrusion 604a of the bottom cover 600.

Since the first fixing protrusion 604a is inserted into the first fixing hole 331a, a movement of third sub-cover 330 in the second direction D2 and the third direction D3 may be reduced or effectively prevented.

Figure 6:
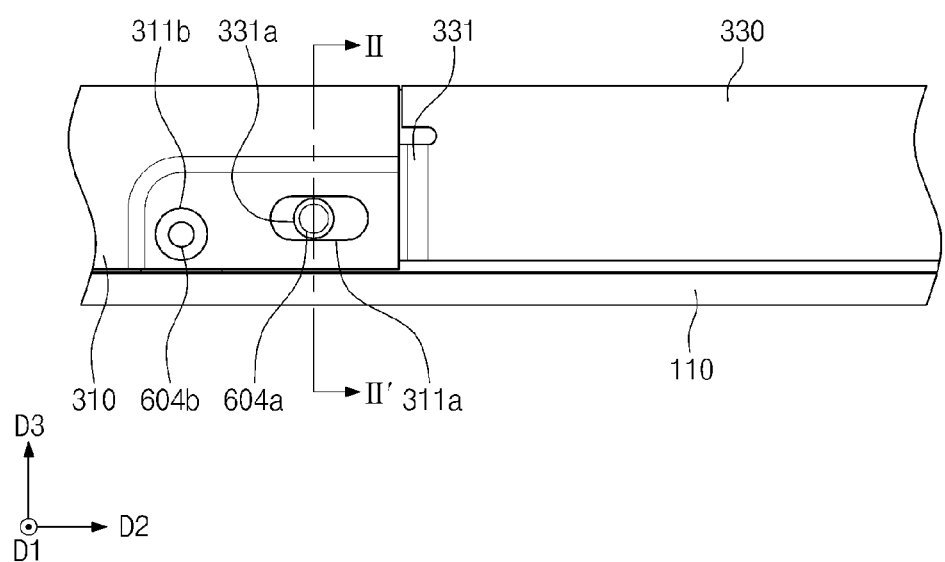
FIG. 6 is a side view showing an exemplary embodiment of a coupling structure between a bottom cover, a third sub-cover and a first sub-cover.
Figure 7:
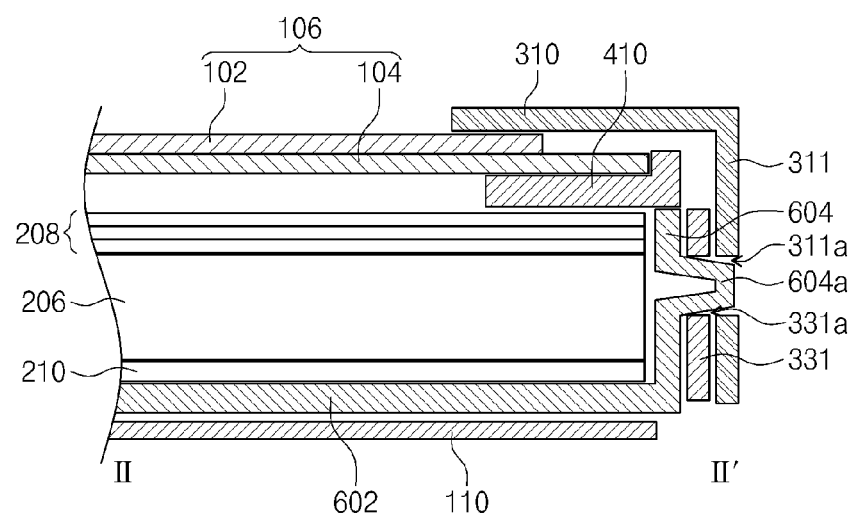
FIG. 7 is a cross-sectional view taken along line II-IF shown in FIG. 6.

FIG. 6 is a side view showing an exemplary embodiment of a coupling structure between a bottom cover, a third sub-cover and a first sub-cover, and FIG. 7 is a cross-sectional view taken along line II-IF shown in FIG. 6.

Referring to FIG. 6 and FIG. 7, when the first sub-cover 310 is mounted on the display panel 106 to cover an edge of the short side of the display panel 106, the fifth fixing hole 311a provided to the first receiving portion 311 of the first sub-cover 310 is engaged to the first fixing protrusion 604a of the bottom cover 600.

Since the first fixing protrusion 604a is inserted into the fifth fixing hole 311a, a movement of the first sub-cover 310 in the second direction D2 and the third direction D3 may be reduced or effectively prevented.

In addition, the first and third sub-covers 310 and 330 are coupled with each other by the first fixing protrusion 604a of the bottom cover 600. The bottom cover 600 supports the display unit 100 and the backlight unit 200 in the display device 1000. Therefore, when the first and third sub-covers 310 and 330 are coupled with each other by the first fixing protrusion 604a which is protruded from the bottom cover 600, a bonding strength between the first and third sub-covers 310 and 330 is improved, thereby preventing a gap between the first and third sub-covers 310 and 330.

In a narrow bezel structure in which a width of an outside area surrounding an active area of a display panel is narrow, the first, second, third, and fourth sub-covers 310, 320, 330 and 340 are fixed to the first and second sidewalls 604 and 606 of the bottom cover 600. As a result, a bonding strength between components of the display apparatus having the narrow bezel structure may be improved.

The first fixing protrusion 604a can prevent a movement of the first and third sub-covers 310 and 330 in the second and third directions D2 and D3, but may not prevent a movement of the first and third sub-covers 310 and 330 in the first direction D1. In an exemplary embodiment, the first sub-cover 310 and the bottom cover 600 may be coupled with each other by an additional coupler such as, for example, a screw, a rivet, etc.

As shown in FIG. 4, the bottom cover 600 further includes a first engaging hole 604c which is formed on the first sidewall 604 and adjacent to the first fixing protrusion 604a. Also, as shown in FIG. 6, the receiving portion 311 of the first sub-cover 310 includes a fifth engaging hole 311b corresponding to the first engaging hole 604c.

Therefore, when the first sub-cover 310 is coupled with the bottom cover 600, the additional coupler (not shown) is engaged to the first engaging hole 604c passing through the fifth engaging hole 311b, thereby essentially preventing movement of the first sub-cover 310 in the first direction D1.

Figure 8:
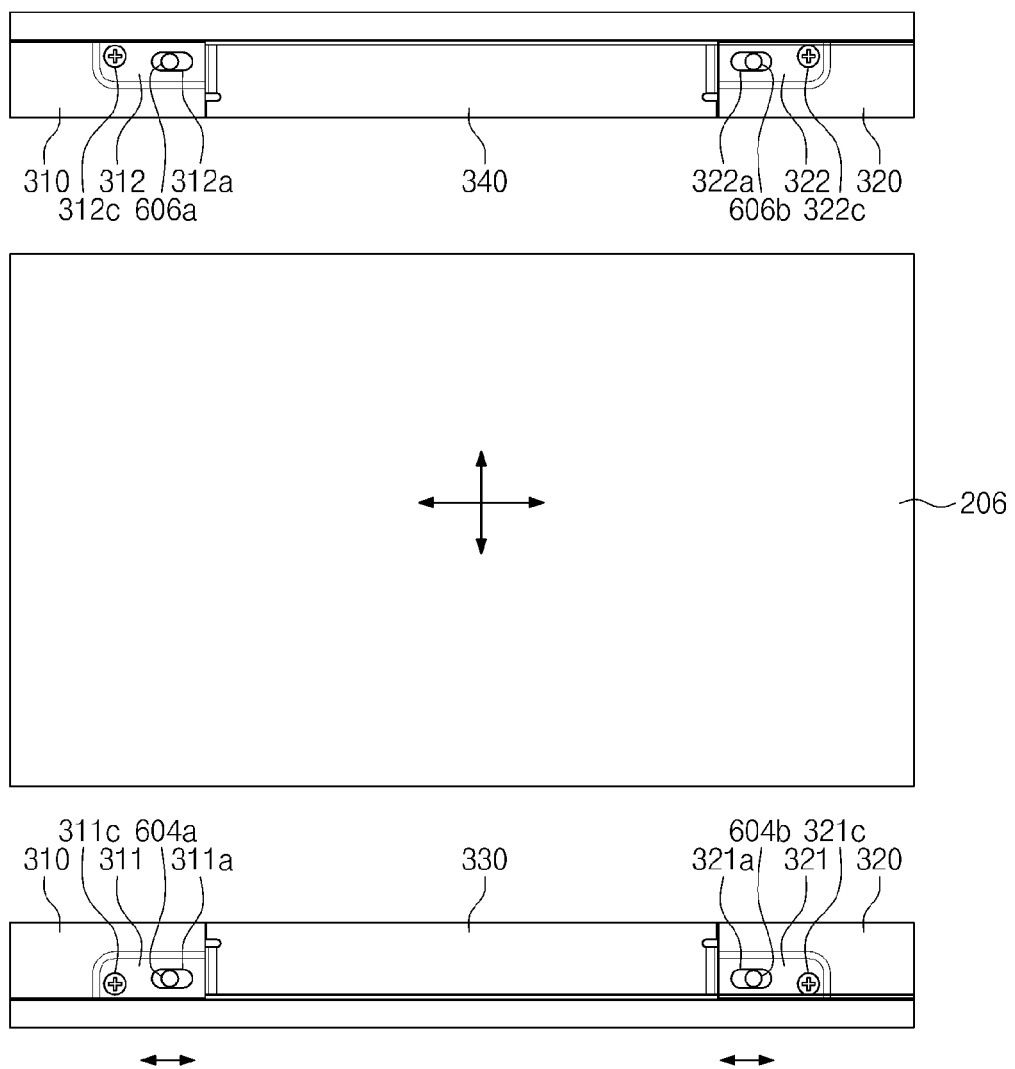
FIG. 8 is a plan view showing a movement of a top cover according to an expansion of a light guide plate.

FIG. 8 is a plan view showing a movement of a top cover according to an expansion of a light guide plate.

Referring to FIG. 8, the first and second light sources 202a and 202b are disposed adjacent to the first and second side surfaces 206a and 206b of the light guide plate 206, respectively. In the exemplary embodiment, the light guide plate 206 may be formed of material such as a polymethylmethacrylate (PMMA).

When the first and second light sources 202a and 202b generate light, the light guide plate 206 may be expanded by a heat which is generated from the first and second light sources 202a and 202b. Especially, the light guide plate 206 is remarkably expanded in a long axis direction thereof.

A structure in which the top cover is divided into the first, second, third, and fourth sub-covers 310, 320, 330 and 340 may be flexible and buffer a distortion in responding to the expansion of the light guide plate 206. In the exemplary embodiment, the fifth and sixth fixing holes 311a and 312a which are formed on the first sub-cover 310 have an elliptical shape extended in the long axis direction of the light guide plate 206. In addition, the seventh and eighth fixing holes 321a and 322a which are formed on the second sub-cover 320 have an elliptical shape extended in the long axis direction of the light guide plate 206.

In case that the light guide plate 206 is expanded in the long axis direction, the first, second, third and fourth fixing protrusions 604a, 604b, 606a and 606b are shifted in the fifth, sixth, seventh, and eighth fixing holes 311a, 312a, 321a and 322a, respectively. Therefore, the top cover 300 may be flexible in responding to the expansion of the light guide plate 206. Consequently, although the light guide plate 206 is expanded, a distortion of the first to fourth sub-covers 310, 320, 330 and 340 or a gap generated in an area in which the first to fourth sub-covers 310, 320, 330 and 340 are coupled with each other may be prevented.

On the other hand, reference numbers of '311c' and '312c' shown in FIG. 8 are referred to screws to fix the first sub-cover 310 to the bottom cover 600, reference numbers of '321c' and '322c' are referred to screws to fix the second sub-cover 320 to bottom cover 600.

Figure 9:
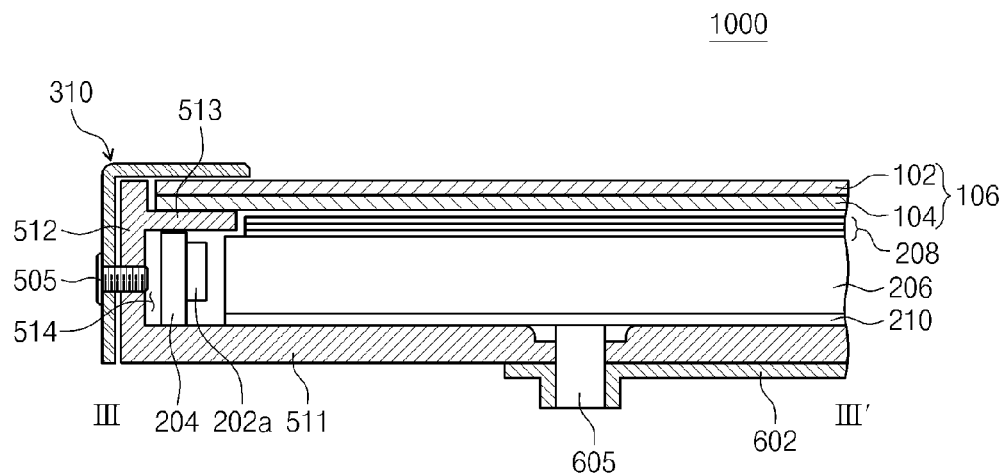
FIG. 9 is a cross-sectional view taken along line III-III' shown in FIG. 2.

FIG. 9 is a cross-sectional view taken along line III-III' shown in FIG. 2.

Referring to FIG. 9, the first heat sink plate 510 is disposed between the backlight unit 200 and the bottom cover 600. According to an exemplary embodiment, the first heat sink plate 510 includes a first bottom portion 511 disposed between the backlight unit 200 and the bottom cover 600, a first sidewall portion 512 extending from the first bottom portion 511 along the first light source supporter 204, and a supporting portion 513 which is extended from the first sidewall portion 512 substantially parallel to the first bottom portion 511 and disposed between the display panel 106 and the backlight unit 200.

The first bottom portion 511 of the first heat sink plate 510 overlaps with the bottom portion 602 of the bottom cover 600 and is engaged to the bottom portion 602 by a screw 605. Also, the first sidewall portion 512 of the first heat sink plate 510 may be engaged to the sidewall of the first sub-cover 310 by a screw 505.

The first light source 202a and the first light source supporter 204 are accommodated in a receiving space 514 provided to an inside of the first heat sink plate 510. The first heat sink plate 510 releases a heat generated from the first and second light sources 202a and 202b to an outside, and the first heat sink plate 510 may comprise a metal such as an aluminum (Al) having a good heat sink property to release the heat.

The display panel 106 is mounted on the first supporting portion 513 of the first heat sink plate 510. Therefore, the first supporting portion 513 performs a substantially same function as the first and second sub-molds 410 and 420 supporting the display panel 106, thereby omitting the mold frame 400 which is provided to the short side of the display panel 106 can be possible.

Although not shown in FIG. 9, the second heat sink plate 520 has a substantially same structure as the first heat sink plate 510. Therefore, a detailed description of the coupling among the second heat sink plate 520, the backlight unit 200 and the display panel 106 is omitted for avoiding the redundancy of the explanation.

Figure 10:
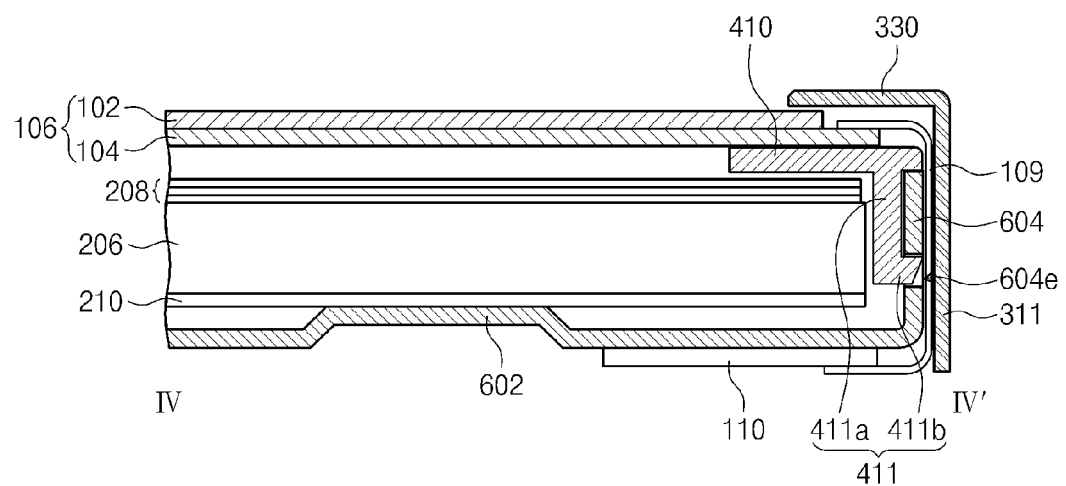
FIG. 10 is a cross-sectional view taken along line IV-IV' shown in FIG. 2.

FIG. 10 is a cross-sectional view taken along line IV-IV' shown in FIG. 2.

Referring to FIG. 10, the first sub-mold 410 may be mounted on an edge portion of the long side of the backlight unit 200. The first sub-mold 410 includes at least one hook 411 to engage to the first sidewall 604 of the bottom cover 600. The hook 411 has an extension portion 411a extended substantially parallel to the first sidewall 604 of the bottom cover 600 and a catching portion 411b protruded from the extension portion 411a toward an outside. The bottom cover 600 further includes a catching hole 604e which is provided to a lower portion of the first sidewall 604 of the bottom cover 600 and engages to the catching portion 411b.

Consequently, the first sub-mold 410 may be fixed to the bottom cover 600 by engaging the hook 411 to the first sidewall 604 of the bottom cover 600.

Although not shown in figures, since the second sub-mold 420 has a substantially same structure as the first sub-mold 410, the second sub-mold 420 may be coupled to the bottom cover 600 in the substantially similar manner as the first sub-mold 410.

As shown in FIG. 10, the printed circuit board 110 is disposed facing a rear surface of the bottom portion 602 of the bottom cover 600.

Figure 11:
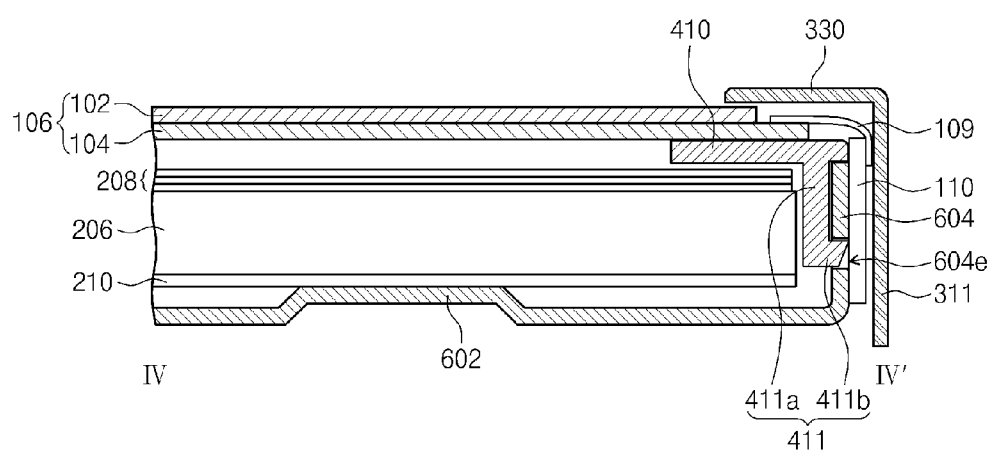
FIG. 11 is a cross-sectional view showing another exemplary embodiment taken along line IV-IV' shown in FIG. 2 of a display apparatus according to the embodiment of the invention.

FIG. 11 is a cross-sectional view showing another exemplary embodiment taken along line IV-IV' shown in FIG. 2 of a display apparatus according to the embodiment of the invention.

As shown in FIG. 11, the printed circuit board 110 may be disposed facing the first sidewall 604 of the bottom cover 600.

Figure 12:
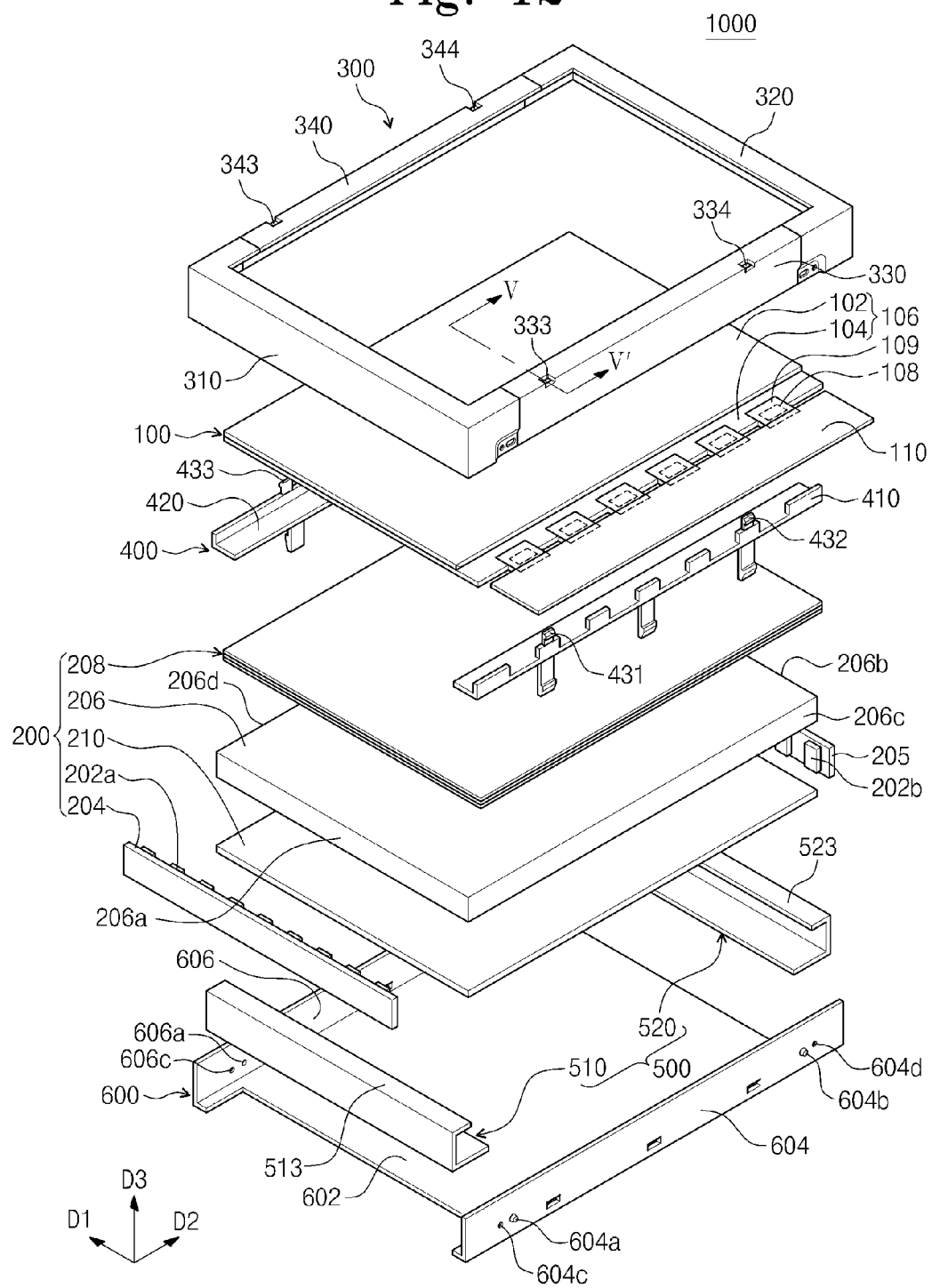
FIG. 12 is an exploded perspective view showing the other exemplary embodiment of a display apparatus according to the embodiment of the invention.
Figure 13:
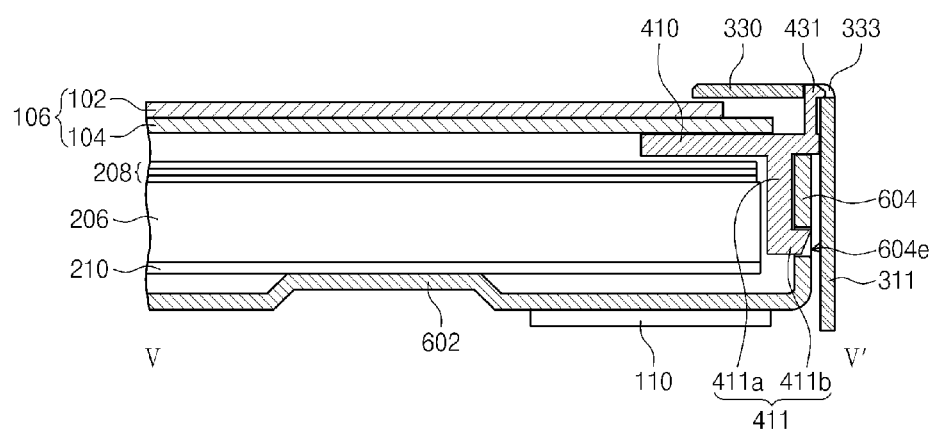
FIG. 13 is a cross-sectional view taken along line V-V' shown in FIG. 12.

FIG. 12 is an exploded perspective view showing a display apparatus according to an exemplary embodiment of the invention, and FIG. 13 is a cross-sectional view taken along line V-V' shown in FIG. 12.

Referring to FIG. 12, the mold frame 400 comprises a first sub-mold 410 and a second sub-mold 420. The first and second sub-molds 410 and 420 are disposed substantially parallel to two long sides of the display panel 106. The first sub-mold 410 includes a first protruding bar 431 and a second protruding bar 432 which are protruded from an upper end portion of a sidewall thereof in the third direction D3, and the second sub-mold 420 includes a third protruding bar 433 and a fourth protruding bar (not shown) which are protruded from an upper portion of a sidewall thereof. In an exemplary embodiment, the first, second, third and fourth protruding bars 431, 432, 433, and (not shown) have a rectangular shape with long sides extended in the second direction D2.

The top cover 300 comprises a first sub-cover 310, a second sub-cover 320, a third sub-cover 330, and a fourth sub-cover 340. The first and second sub-covers 310 and 320 are disposed along short sides of the display panel 106, and the third and fourth sub-covers 330 and 340 are disposed along long sides of the display panel 106.

The third sub-cover 330 of the top cover 300 includes a first opening portion 333 and a second opening portion 334 which are opened corresponding to the first and second protruding bars 431 and 432 of the first sub-mold 410, respectively. In addition, the fourth sub-cover 340 of the top cover 300 includes a third opening portion 343 which is opened corresponding to the third protruding bar 433 and a fourth opening portion 344 which is opened corresponding to the fourth protruding bar.

As shown in FIG. 13, when the mold frame 400 and the top cover 300 are coupled with each other, the first and second protruding bars 431 and 432 are inserted into the first and second opening portions 333 and 334, respectively, and the third protruding bar 433 and the fourth protruding bar are inserted into the third and fourth opening portions 343 and 344, respectively. Therefore, the first, second, third, and fourth protruding bars 431, 432, 433, and (not shown) may prevent a movement of the third and fourth sub-covers 330 and 340 in the second direction D2.

In addition, each of the first, second, third, and fourth protruding bars 431, 432, 433, and (not shown) further includes a catching jaw to prevent movement of the third and fourth sub-covers 330 and 340 in the third direction D3.

In a structure in which the top cover 300 is divided into four sub-covers 310 to 340, the top cover 300 is primary coupled with the bottom cover 600 and secondary coupled with the mold frame 400, thereby improving a bonding strength between components and preventing a movement of the components in a predetermined direction.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display apparatus comprising:
 a display unit configured to display an image;
 a receiving container configured to accommodate the display unit; and
 a top cover configured to be coupled to the receiving container,
 wherein the top cover comprises a plurality of sub-covers disposed at an edge of the display unit and two sub-covers of the plurality of sub-covers overlap with each other,
 wherein the receiving container comprises a first fixing part corresponding to a position that adjacent two sub-covers of the plurality of sub-covers overlap with each other, and each of the adjacent two sub-covers comprises a second fixing part coupled to the first fixing part, and
 wherein each of the adjacent two sub-covers forms a partial portion of a bezel that surrounds edges of a top surface of the display unit.

2. The display apparatus of claim 1, wherein the first fixing part is provided with a fixing protrusion disposed on the receiving container and the second fixing part is provided with a fixing hole, and
 wherein a position of one of the adjacent two sub-covers relative to a position of the other one of the adjacent two sub-covers is configured to be changed.

3. The display apparatus of claim 2, wherein the receiving container further comprises a bottom portion which accommodates the display unit thereon and a sidewall which is extended from the bottom portion, and
 the fixing protrusion is provided on the sidewall of the receiving container.

4. The display apparatus of claim 3, wherein the fixing hole formed through one sub-cover of the adjacent two sub-covers has an elliptical shape extended in a longitudinal direction of the sidewall,
 wherein a size of the elliptical shape determines a range in which the position of one of the adjacent two sub-covers changes.

5. The display apparatus of claim 3, wherein the sidewall of the receiving container comprises a first engaging hole adjacent to the fixing protrusion, one sub-cover of the adjacent two sub-covers comprises a second engaging hole corresponding to the first engaging hole, and the receiving container and the one sub-cover are coupled with each other by a coupler passing through the first engaging hole and the second engaging hole.

6. The display apparatus of claim 3, wherein the display unit comprises:
a display panel configured to display the image;
a plurality of flexible films attached to the display panel; and
a printed circuit board electrically connected with the display panel by the plurality of flexible films.

7. The display apparatus of claim 6, wherein the plurality of flexible films are bent and cover the sidewall of the receiving container,
the printed circuit board faces a rear surface of the bottom portion of the receiving container, and
the fixing protrusion is disposed between two flexible films adjacent to each other or is disposed at an outside of an outermost flexible film of the plurality of flexible films.

8. The display apparatus of claim 2, further comprising a backlight unit configured to provide a light to the display unit, wherein the plurality of sub-covers comprises:
first and second sub-covers disposed in a short axis direction of the backlight unit; and
third and fourth sub-covers disposed in a long axis direction of the backlight unit, and
wherein two end portions of the first and second sub-covers are bent and extended in the long axis, respectively.

9. The display apparatus of claim 8, wherein the receiving container further comprises a bottom portion which accommodates the backlight unit thereon and first and second sidewalls which are extended from the bottom portion and are substantially parallel to the long axis, and
wherein the first sidewall comprises a first fixing protrusion and a second fixing protrusion and the second sidewall comprises a third fixing protrusion and a fourth fixing protrusion.

10. The display apparatus of claim 9, wherein two end portions of the third sub-cover comprise a first protruding portion and a second protruding portion which protrude toward the first and second sub-covers, respectively,
two end portions of the fourth sub-cover comprise a third protruding portion and a fourth protruding portion which protrude toward the first and second sub-covers, respectively,
the first and second protruding portions comprise first and second fixing holes coupled to the first and second fixing protrusions on the first side wall, respectively, and
the third and fourth protruding portions comprise third and fourth fixing holes coupled to the third and fourth fixing protrusions on the second wide wall, respectively.

11. The display apparatus of claim 10, wherein two end portions of the first sub-cover overlap the first protruding portion of the third sub-cover and the third protruding portion of the fourth sub-cover, respectively and comprise fifth and sixth fixing holes coupled to the first and third fixing protrusions, respectively.

12. The display apparatus of claim 10, wherein two end portions of the second sub-cover overlap the second protruding portion of the third sub-cover and the fourth protruding portion of the fourth sub-cover, respectively and comprise seventh and eighth fixing holes coupled to the second and fourth fixing protrusions, respectively.

13. The display apparatus of claim 10, wherein each of the fifth to eighth fixing holes has an elliptical shape extended in the long axis direction of the backlight unit.

14. The display apparatus of claim 8, wherein the receiving container comprises a first engaging hole coupled to the two end portions of the first and second sub-covers, the two end portions of the first and second sub-covers comprise a second engaging hole corresponding to the first engaging hole, and the first and second sub-covers are coupled to the receiving container by a coupler passing through the first and second engaging holes.

15. The display apparatus of claim 1, further comprising a backlight unit comprising
a light source configured to generate and emit the light; and
a light guide plate configured to receive the light through at least one side surface thereof and guide the light to the display unit.

16. The display apparatus of claim 15, further comprising a heat sink plate coupled to the receiving container and configured to release heat generated from the light source,
wherein the heat sink plate is exposed to an outside.

17. The display apparatus of claim 16, wherein the heat sink plate comprises a supporting portion configured to accommodate the display unit thereon.

18. The display apparatus of claim 16, wherein the receiving container and the heat sink plate comprise a metallic material.

19. The display apparatus of claim 1, further comprising a mold frame which is disposed to at least two side of the display unit configured to support the display unit,
wherein the mold frame is coupled with the receiving container.

20. The display apparatus of claim 19, wherein the mold frame comprises two sub-molds which are extended in a long axis direction of the display unit, and
each of the two sub-molds comprises a protruding bar on an upper end portion of a sidewall thereof.

21. The display apparatus of claim 20, wherein at least one of the sub-covers of the top cover comprises an opening portion which is opened corresponding to the protruding bar, and
the protruding bar is disposed in the opening portion.

* * * * *